(12) United States Patent
Kishimoto et al.

(10) Patent No.: US 12,308,188 B2
(45) Date of Patent: May 20, 2025

(54) SENSOR HAVING SHIELD FILM COVERING MAIN SUBSTRATE FOR IMMUNIZING NOISE

(71) Applicant: OMRON Corporation, Kyoto (JP)

(72) Inventors: Yukitaka Kishimoto, Kyoto (JP); Yusuke Nakayama, Kyoto (JP); Yuki Ushiro, Kyoto (JP); Takashi Muramatsu, Kyoto (JP); Naoki Nishimori, Kyoto (JP)

(73) Assignee: OMRON Corporation, Kyoto (JP)

( * ) Notice: Subject to any disclaimer, the term of this patent is extended or adjusted under 35 U.S.C. 154(b) by 76 days.

(21) Appl. No.: 17/920,808

(22) PCT Filed: Mar. 2, 2021

(86) PCT No.: PCT/JP2021/007950
§ 371 (c)(1),
(2) Date: Oct. 24, 2022

(87) PCT Pub. No.: WO2021/229896
PCT Pub. Date: Nov. 18, 2021

(65) Prior Publication Data
US 2023/0170168 A1 Jun. 1, 2023

(30) Foreign Application Priority Data

May 14, 2020 (JP) .................. 2020-084904

(51) Int. Cl.
*H01H 36/00* (2006.01)
*G01R 33/02* (2006.01)
*H05K 9/00* (2006.01)

(52) U.S. Cl.
CPC ........... *H01H 36/008* (2013.01); *G01R 33/02* (2013.01); *H05K 9/0009* (2013.01)

(58) Field of Classification Search
CPC ..... H01H 36/008; G01R 33/02; H05K 9/0009
See application file for complete search history.

(56) References Cited

U.S. PATENT DOCUMENTS

| | | | | |
|---|---|---|---|---|
| 4,903,000 A | * | 2/1990 | Yajima | G01L 19/0681 338/4 |
| 5,572,120 A | * | 11/1996 | Takaishi | H05K 9/0047 324/207.21 |

FOREIGN PATENT DOCUMENTS

| | | |
|---|---|---|
| JP | H01122533 | 5/1989 |
| JP | H0358840 | 6/1991 |

(Continued)

OTHER PUBLICATIONS

"International Search Report (Form PCT/ISA/210) of PCT/JP2021/007950", mailed on May 25, 2021, with English translation thereof, pp. 1-6.

(Continued)

*Primary Examiner* — Walter L Lindsay, Jr.
*Assistant Examiner* — Milton Gonzalez
(74) *Attorney, Agent, or Firm* — JCIPRNET

(57) ABSTRACT

A sensor includes: a receptacle connectable to an external plug; a second housing accommodating at least part of the receptacle; a main substrate on which an electronic component used for sensing is mounted; a shield film covering at least part of the main substrate and shielding an electromagnetic wave emitted from the main substrate and/or an electromagnetic wave to penetrate the main substrate from the outside; a first housing accommodating at least part of the main substrate and at least part of the shield film; a flexible substrate connecting the main substrate and the receptacle; and a protection member abutting on an end of the shield film from the side opposite to the main substrate, the end of the shield film facing the flexible substrate.

13 Claims, 4 Drawing Sheets

(56) References Cited

FOREIGN PATENT DOCUMENTS

| | | |
|---|---|---|
| JP | H07302956 | 11/1995 |
| JP | 2003031092 | 1/2003 |
| JP | 2004119445 | 4/2004 |
| JP | 2009048902 | 3/2009 |
| JP | 2011165323 | 8/2011 |
| JP | 2014229878 | 12/2014 |

OTHER PUBLICATIONS

"Written Opinion of the International Searching Authority (Form PCT/ISA/237) of PPCT/JP2021/007950", mailed on May 25, 2021, with English translation thereof, pp. 1-8.

* cited by examiner

SENSOR HAVING SHIELD FILM COVERING MAIN SUBSTRATE FOR IMMUNIZING NOISE

CROSS-REFERENCE TO RELATED APPLICATION

This application is a 371 application of the International PCT application serial no. PCT/JP2021/007950, filed on Mar. 2, 2021, which claims the priority benefits of Japan Patent Application No. 2020-084904, filed on May 14, 2020. The entirety of each of the above-mentioned patent applications is hereby incorporated by reference herein and made a part of this specification.

TECHNICAL FIELD

The disclosure relates to a sensor that may be assembled by dividing a housing.

RELATED ART

A connector-type sensor, which has a receptacle and may attach and detach a cable having a plug paired with the receptacle, is on the market. In the case of a cable-integrated sensor, even if a main substrate, on which the electronic components used for sensing are mounted, is accommodated in an integrated structure housing, cables may be connected to the main substrate by carrying out assembly work such as soldering from an opening of the housing. On the other hand, in the case of a connector-type sensor, since a contact terminal of the receptacle connected to the main substrate are located deep inside the housing, unless the housing is divided to expose the contact terminal of the receptacle to the outside of the housing, work such as soldering is difficult.

For example, in Patent Literature 1, a proximity sensor is disclosed in which a cylindrical housing is divided into a case body and a holder case, and one end of a flexible substrate is connected to a terminal pin of a receptacle accommodated in the holder case, and the other end of the flexible substrate is connected to a back surface of a circuit board accommodated in the case body, and the flexible substrate is bent to assemble the holder case to the case body.

CITATION LIST

Patent Literature

[Patent Literature 1] Japanese Patent Application Laid-Open No. 2011-165323

SUMMARY

Technical Problem

However, there is a demand from the market to make the size of the sensor smaller (shorter body). As the size of the sensor becomes smaller, the empty space inside the housing becomes narrower. If the accommodation space for the flexible substrate and the accommodation space for the main substrate overlap, the flexible substrate interferes with a shield film that covers the main substrate and is made of metal foil and the like, and an end of the shield film may be deformed and turned up in the process of folding the flexible substrate that connects the divided housings. If the shield film is deformed, there is a possibility that the resistance (immunity) of the sensor to electromagnetic waves from the outside may deteriorate.

Therefore, the disclosure provides a sensor demonstrating high manufacturability and excellent noise immunity, in which an end of a shield film is not easily turned up even when the sensor is configured from a divided housing.

Solution to Problem

A sensor according to an embodiment of the disclosure includes: a receptacle capable of being connected to an external plug; a second housing in which at least a part of the receptacle is accommodated; a main substrate on which an electronic component used for sensing is mounted; a shield film covering at least a part of the main substrate and shielding at least one of an electromagnetic wave emitted from the main substrate and an electromagnetic wave to penetrate the main substrate from an outside; a first housing in which at least a part of the main substrate and at least a part of the shield film are accommodated; a flexible connection member connecting the main substrate and the receptacle; and a protection member abutting on an end of the shield film from a side opposite to the main substrate, the end of the shield film facing the connection member.

According to this embodiment, since the housing may be divided into the first housing and the second housing and assembled, it is suitable for a connector-type sensor provided with a receptacle. When the housing is divided, a connection member such as a flexible substrate or a cable that is folded when the second housing is assembled to the first housing interferes, and the end of the shield film may be turned up and deformed. According to this embodiment, the deformation of the shield film may be prevented by the protection member that abuts on the end of the shield film from the side opposite to the main substrate. Therefore, a sensor may be provided which demonstrates high manufacturability and excellent noise immunity, in which an end of a shield film is not easily turned up even when the sensor is configured from a divided housing.

In the above embodiment, the sensor may further include a sealing resin that seals the electronic component used for sensing, and the protection member may have a cantilever structure in which one end of the protection member abuts on the end of the shield film, and another end is buried and fixed in the sealing resin.

According to this embodiment, since the protection member is fixed to the sealing resin, the position of the protection member is less likely to shift even if a force is applied from the connection member. It is possible to more reliably prevent the turning up of the shield film.

In the above embodiment, the sensor may further include a cylindrical insulating member fitted inside the second housing. The shield film may include: a winding part that is wound around the main substrate in a lateral direction intersecting a longitudinal direction of the main substrate, covers a part of a front surface and a part of a back surface of the main substrate, and covers a part of an end surface of the main substrate; and a tongue part that protrudes from the winding part and covers only a part of the front surface and/or a part of the back surface of the main substrate, and at least a part of the tongue part may configure the end of the shield film facing the connection member, and overlap the insulating member in a thickness direction of the main substrate.

This embodiment further includes an insulating member that secures a dielectric strength distance from the inner peripheral surface of the second housing and protects the connection member against static electricity from the outside. The shield film is trimmed so as not to interfere with the insulating member, and has a tongue part formed at the end facing the connection member. The tongue part is more easily turned up than the winding part. According to this embodiment, the protection member that abuts against the tongue part from the side opposite to the main substrate may prevent deformation of the end of the shield film even if it is formed on the tongue part that is likely to turn up.

In the above embodiment, the protection member may be made of a material having higher rigidity than the connection member.

According to this embodiment, the protection member has high rigidity and is less likely to deform even when it is brought to abut on the flexible connection member. It is possible to more reliably prevent the deformation of the shield film.

In the above embodiment, the protection member may be made of an FR-4 grade laminate that conforms to ANSI standards.

According to this embodiment, the protection member having higher rigidity than the connection member may be made of an easily available and inexpensive material.

A sensor according to another embodiment of the disclosure includes: a main substrate on which an electronic component used for sensing is mounted; a shield film covering at least a part of the main substrate and shielding at least one of an electromagnetic wave emitted from the main substrate and an electromagnetic wave to penetrate the main substrate from an outside; and a protection member abutting on an end of the shield film from a side opposite to the main substrate. The sensor may further include a sealing resin that seals the electronic component used for sensing. The protection member may have a cantilever structure in which one end of the protection member abuts on the end of the shield film, and another end is buried and fixed in the sealing resin.

According to this embodiment, the deformation of the shield film may be prevented by the protection member that abuts on the end of the shield film from the side opposite to the main substrate. For example, when a cable is mounted in a cable-integrated sensor, the cable may be prevented from interfering with the shield film and deforming the shield film to turn up.

Effects of Invention

According to the disclosure, a sensor may be provided which demonstrates high manufacturability and excellent noise immunity, in which an end of a shield film is not easily turned up even when the sensor is configured from a divided housing.

DESCRIPTION OF THE EMBODIMENTS

Figure 1:
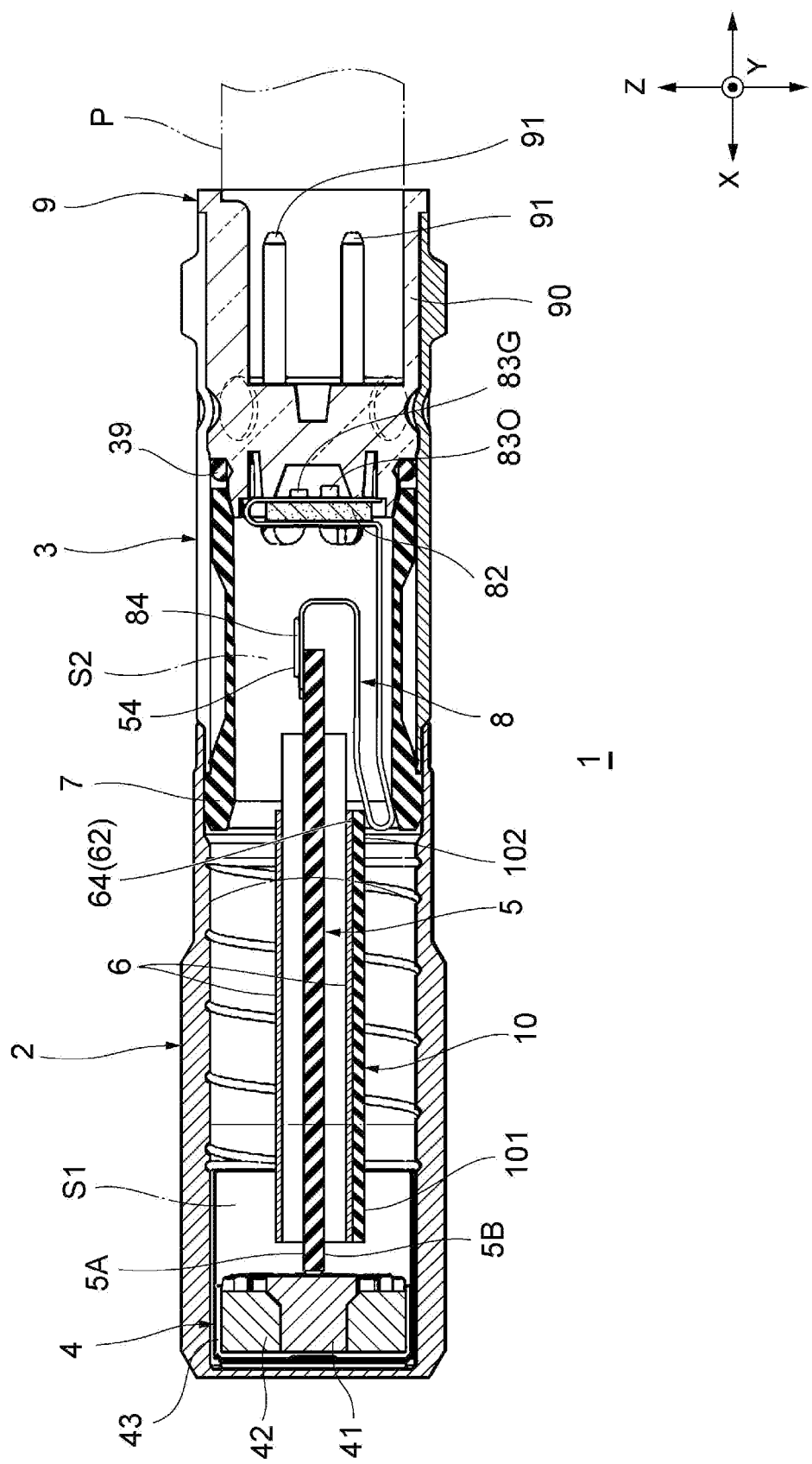
FIG. 1 is a cross-sectional view showing an internal structure of a sensor according to an embodiment of the disclosure.

Exemplary embodiments of the disclosure will be described with reference to the accompanying drawings. In each figure, those with the same reference numerals have the same or similar configurations. Hereinafter, each configuration will be described in detail with reference to FIGS. 1 to 4. FIG. 1 is a cross-sectional view showing an internal structure of a sensor 1 according to an embodiment of the disclosure. As shown in FIG. 1, the sensor 1 is a columnar connector-type sensor, and includes a receptacle (socket) 9 configured to be connectable with an external plug P.

In the illustrated example, the sensor 1 is configured as a proximity sensor including a detection part 4 that detects the presence or position of a metal object using a magnetic field. The sensor 1 is not limited to a proximity sensor, and may be an optical sensor including at least one of a light emitting part that emits light and a light receiving part that receives light as a detection part, or may be another type of sensor.

A detection part 4 is accommodated at one end (hereinafter referred to as the tip end) of the sensor 1. A receptacle 9 is provided at the other end (hereinafter referred to as the base end) opposite to the one end. The detection part 4 includes, for example, a core 41 such as an iron core, a coil 42 that is a winding wire wound around the core 41, and a coil case 43 that houses the core 41 and the coil 42, and is connected to a main circuit (5, 53, 54, 6, . . . ) that control the detection part 4.

The main circuit (5, 53, 54, 6, . . . ) includes a substantially rectangular main substrate 5, an electronic component 53 and a mounting part 54 mounted on the main substrate 5, and a shield film 6 made of copper foil or the like. The electronic component 53 is connected with the detection part 4 and used for sensing. The mounting part 54 is a soldering land pattern, a connector, or the like, is located on the side opposite to the detection part 4 on a front surface 5A of the main substrate 5, and is used for connection with a flexible substrate 8, which will be described later.

Silicone resin or the like is applied to the front surface 5A and the back surface 5B of the main substrate 5 to protect the electronic component 53. The shield film 6 is wound around and fixed to the main substrate 5 with double-sided tape or the like. The shield film 6 may shield electromagnetic waves and static electricity emitted from the main substrate 5 or may shield electromagnetic waves and static electricity that try to penetrate the main substrate 5 from the outside.

The housing (2, 3) forming the outer shape of the sensor 1 is formed in a substantially cylindrical shape from a material such as metal. The housing (2, 3) is configured to be divisible into a first housing 2 and a second housing 3. At least a part of the first housing 2 is filled with a primary sealing resin S1 such as an epoxy resin. The primary sealing resin S1 fills the gaps between the detection part 4 and the main circuit (5, 53, 54, 6, . . . ) accommodated in the first housing 2 and fixes them to each other.

The second housing 3 is filled with a secondary sealing resin S2 such as an epoxy resin similar to the primary sealing resin S1. The secondary sealing resin S2 fills the gaps between the components accommodated in the second housing 3 and fixes them to each other. Further, the secondary sealing resin S2 is filled across the first housing 2 and the second housing 3 to fix the first and second housings 2 and 3 to each other.

The first housing 2 and the second housing 3 are connected by a flexible substrate (flexible printed wiring board) 8. The flexible substrate 8 is an example of a flexible connection member. The connection member is not limited to the flexible substrate 8, and may be a flexible cable or the like. The base film of the flexible substrate 8 is made of polyimide resin or the like and has a thickness of 50 μm or less. The sensor 1 of this embodiment includes a protection member 10 that protects the shield film 6 from the flexible substrate 8. The protection member 10 is preferably made of a material having higher rigidity than the flexible substrate 8. An example of the material for the protection member 10 is an FR-4 grade laminate conforming to the ANSI standard. The material of the protection member 10 may be another type of rigid substrate, or may be a material other than the rigid substrate.

The protection member 10 is in contact with the shield film 6 from the side opposite to the main substrate 5 on at least one of the front surface 5A and the back surface 5B of the main substrate 5. In the illustrated example, the protection member 10 is disposed on the back surface 5B side and adhered to the shield film 6 with double-sided tape or the like. In the illustrated example, the protection member 10 has a cantilever structure in which one end (rear end) 102 of the protection member 10 abuts on an end 62 of the shield film 6, and the other end (front end) 101 is buried in the primary sealing resin S1. The primary sealing resin S1 is an example of a sealing resin that fixes the end 101 of the protection member 10, which will be described later. The shape of the shield film 6 will be described later in detail with reference to FIG. 3.

Figure 2:
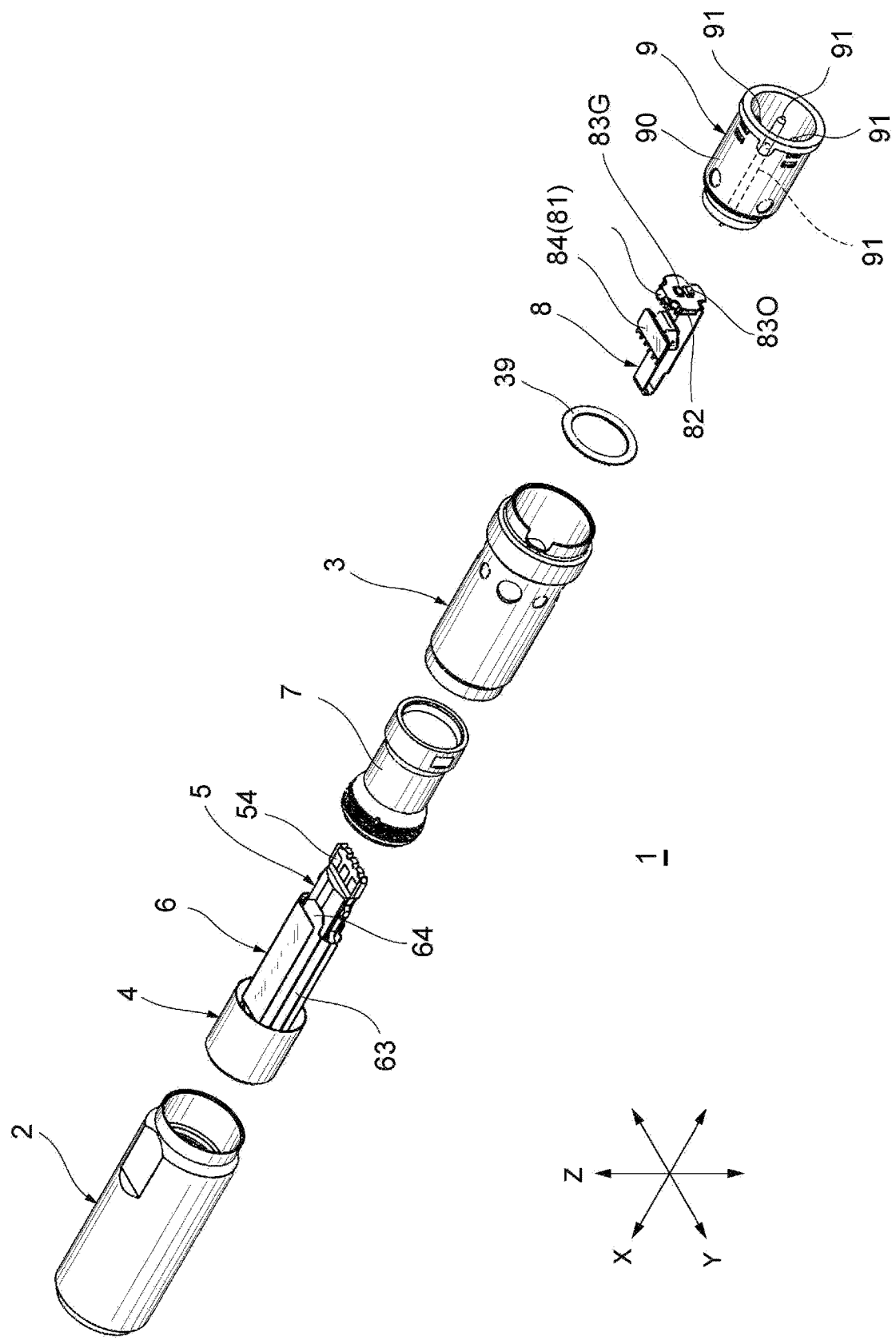
FIG. 2 is an exploded perspective view of the sensor shown in FIG. 1.

FIG. 2 is an exploded perspective view of the sensor 1 shown in FIG. 1. As shown in FIG. 2, the second housing 3 configuring the housing (2, 3) accommodates a part of the main circuit (5, 53, 54, 6, . . . ), a part of the flexible substrate 8, a receptacle 9, and a cylindrical insulating member 7 made of a resin material. The flexible substrate 8 has one end (rear end) 82 to which the receptacle 9 is connected by soldering or the like, and the other end (front end) 81 is provided with a mounting part 84. The mounting part 84 of the flexible substrate 8 is a soldering land pattern, a connector, or the like, similar to the mounting part 54 of the main substrate 5, and is connected to the mounting part 54.

In addition to the receptacle 9, light emitting elements 83G and 83O may be mounted on the end 102 of the flexible substrate 8. The light emitting element 83G is, for example, a communication indicator lamp and is a green light emitting diode. The light emitting element 83O is, for example, an operation indicator lamp and is an orange light emitting diode. The insulating member 7 is fitted inside the first and second housings 2 and 3. Due to the thickness of the insulating member 7, it is possible to secure a dielectric strength distance for protecting the main circuit (5, 53, 54, 6, . . . ), the flexible substrate 8 and their soldered parts against static electricity from the outside of the housing (2, 3).

The receptacle 9 has at least one contact terminal 91 and an insulator 90 supporting the contact terminal 91. In the illustrated example, the contact terminal 91 is a bar-shaped connector pin. The shape of the contact terminal 91 is not limited to a bar shape, and may be another shape.

The insulator 90 is an insulator that is made of a resin material and supports the multiple contact terminals 91 so that they do not come into contact with each other. In the illustrated example, the insulator 90 is formed in a cup shape having a flange part. The contact terminal 91 is disposed deep inside the housing (2, 3) by the length of the insulator 90. An airtight member 39 such as an O-ring is attached to the gap between the insulator 90 and the second housing 3.

Figure 3:
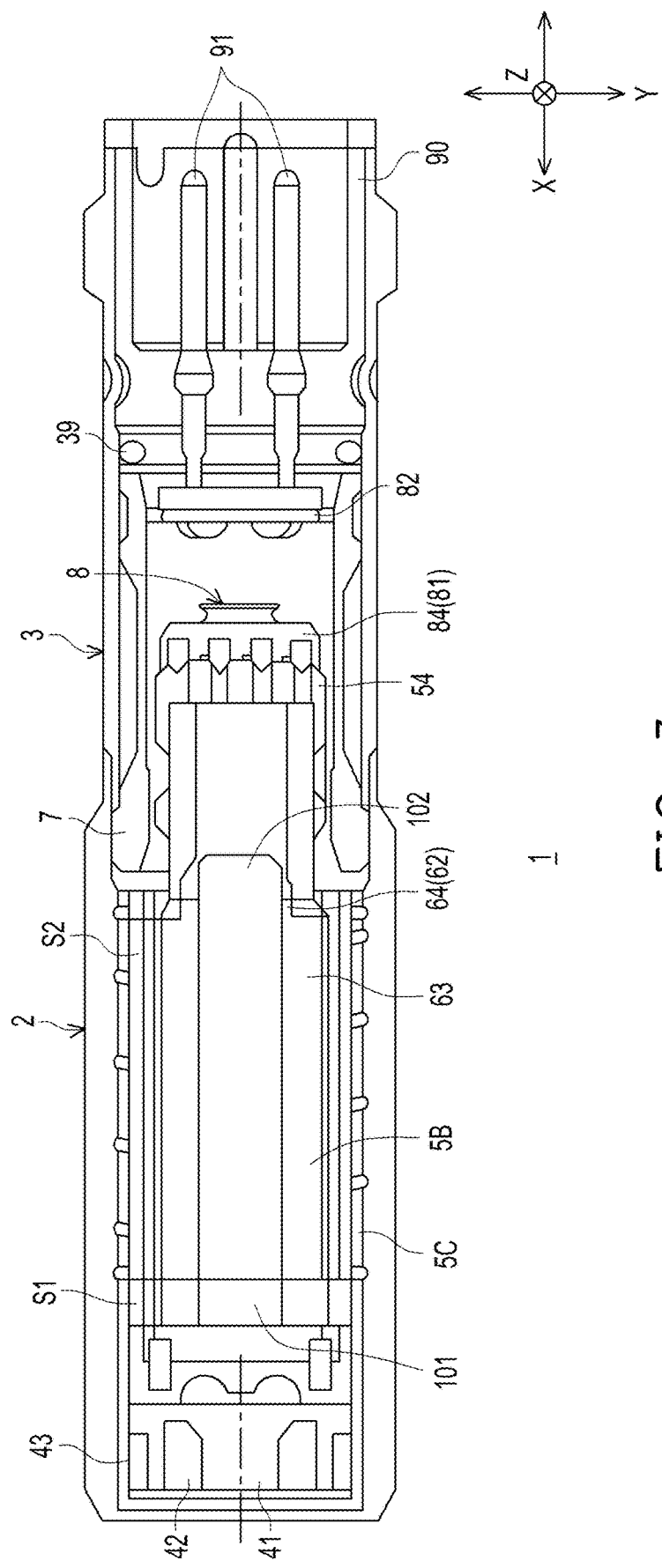
FIG. 3 is a cross-sectional view of the shield film and the protection member shown in FIG. 1 as viewed from the back surface side of the main substrate.

FIG. 3 is a cross-sectional view of the shield film 6 and the protection member 10 shown in FIG. 1 as viewed from the back surface 5B side of the main substrate 5. As shown in FIG. 3, the shield film 6 is trimmed so as not to interfere with the insulating member 7 and has a winding part 63 and a tongue part 64 protruding from the winding part 63. The winding part 63 is wound around the main substrate 5 in a lateral direction Y intersecting the longitudinal direction X of the main substrate 5, and covers not only a part of the front surface 5A (see FIG. 1) and a part of the back surface 5B of the main substrate 5, but also a part of an end surface 5C of the main substrate connecting the front surface 5A and the back surface 5B.

In addition, the tongue part 64 covers only a part of the front surface 5A and/or a part of the back surface 5B of the main substrate 5. In the example shown in FIGS. 1 to 3, a pair of front and back tongue parts 64 are formed along a part of the front surface 5A and the back surface 5B. At least a part of the tongue part 64 overlaps the insulating member 7 described above in the thickness direction Z of the main substrate 5.

The tongue part 64 configures the end of the shield film 6 facing the flexible substrate 8. The one end 102 of the protection member 10 abuts on the tongue part 64. When the tongue part 64 is formed on the front and back sides, the protection member 10 may be disposed on one of the tongue parts 64 (in the illustrated example, the tongue part 64 on the back surface 5B side). The flexible substrate 8 is accommodated in the accommodation space on the side where the protection member 10 is disposed.

Figure 4:
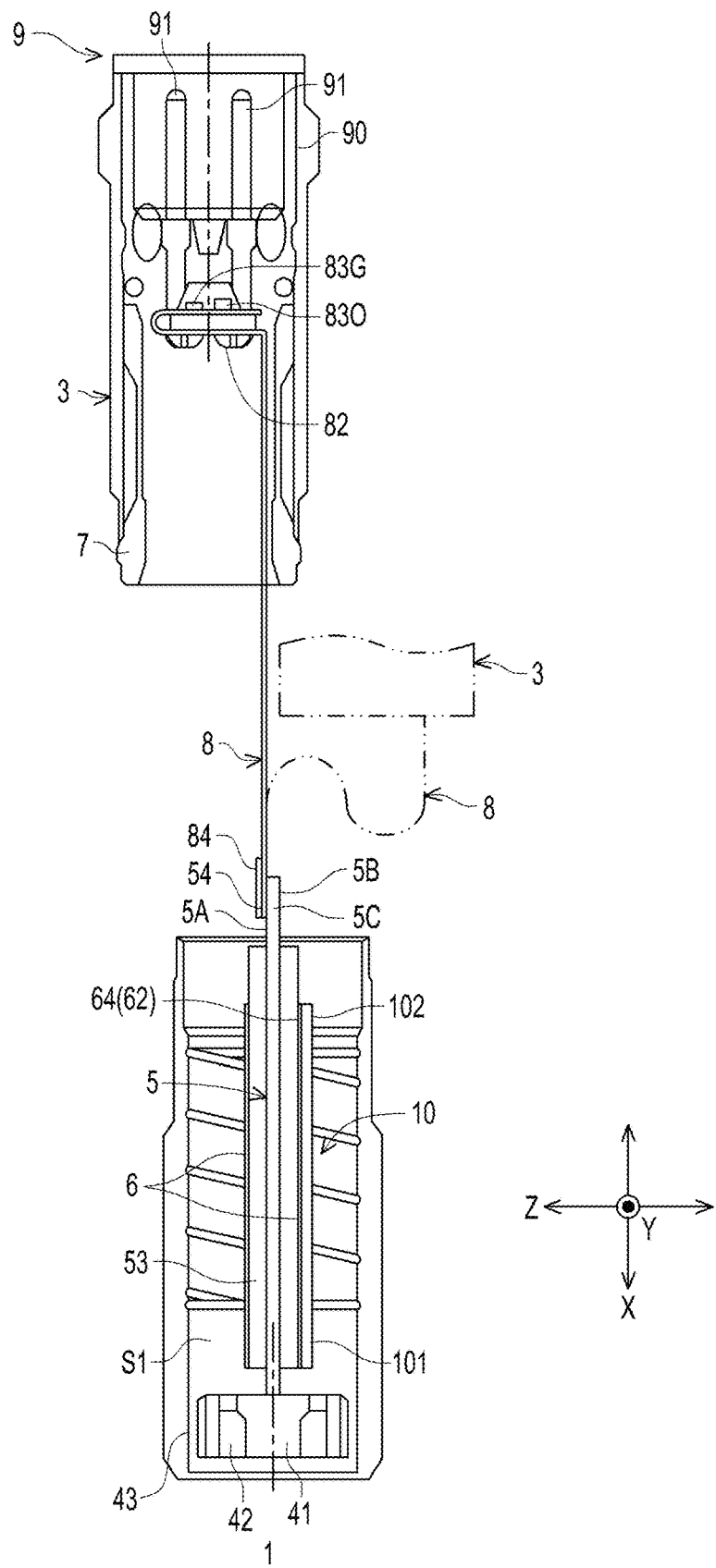
FIG. 4 is a cross-sectional view showing a state before the flexible substrate shown in FIG. 1 is folded.

FIG. 4 is a cross-sectional view showing a state before the flexible substrate 8 shown in FIG. 1 is folded. As shown in FIG. 4, in a state after being sealed with the primary sealing resin S1 and before being sealed with the secondary sealing resin S2, the flexible substrate 8 connects the main substrate 5 accommodated in the first housing 2 and the receptacle 9 accommodated in the second housing 3. The first and second housings 2 and 3 may be freely moved within the length of the flexible substrate 8. The receptacle 9 is soldered to the flexible substrate 8.

In order to assemble the sensor 1 from the half-finished product shown in FIG. 4, in a state where the first housing 2 and the second housing 3 are separated, the resin composition of the secondary sealing resin S2 is injected into the first housing 2 with the detection part 4 facing downward in the vertical direction. The flexible substrate 8 is folded along the insulating member 7, and the second housing 3 is attached to the first housing 2. The housing (2, 3) is turned upside down so that the receptacle 9 faces downward in the vertical direction, and the resin composition of the secondary sealing resin S2 is cured by heating or the like.

In such an assembly method, in the process of folding the flexible substrate 8 indicated by the two-dot chain line in FIG. 4, if the accommodation space of the flexible substrate overlaps the accommodation space of the main substrate without the protection member 10 being provided, the flexible substrate may interfere with the shield film.

According to the sensor 1 of this embodiment configured as described above, even if the housing (2, 3) is divided and configured, the end 62 of the shield film 6 is less likely to be turned up by the protection member 10 that abuts on the end 62 of the shield film 6 from the side opposite to the main substrate 5. Even if the end 62 is formed with the tongue part 64 which is likely to be turned up, the deformation of the shield film 6 may be prevented.

Moreover, since the protection member 10 is fixed to be buried in the primary sealing resin S1, even if a force is applied from the flexible substrate 8, the position of the protection member 10 is unlikely to shift. The protection member 10 is made of a material such as an FR-4 grade laminate having higher rigidity than the flexible substrate 8, and is less likely to be deformed even when it abuts on the flexible substrate 8.

The embodiments described above are for facilitating the understanding of the disclosure, and are not for limiting the interpretation of the disclosure. Each element included in the embodiments and its disposition, material, condition, shape, size, and the like are not limited to those exemplified, and may be changed as appropriate. Further, it is possible to replace or combine a part of the configurations shown in different embodiments. A part or all of this embodiment may be described as the following appendix descriptions, but is not limited to the following.

APPENDIX

A sensor (1) includes:
a receptacle (9) capable of being connected to an external plug (P);
a second housing (3) in which at least a part of the receptacle is accommodated;
a main substrate (5) on which an electronic component (53) used for sensing is mounted;
a shield film (6) covering at least a part of the main substrate and shielding at least one of an electromagnetic wave emitted from the main substrate and an electromagnetic wave to penetrate the main substrate from an outside;
a first housing (2) in which at least a part of the main substrate and at least a part of the shield film are accommodated;
a flexible connection member (8) connecting the main substrate and the receptacle; and
a protection member (10) abutting on an end of the shield film from a side opposite to the main substrate, the end of the shield film facing the connection member.

What is claimed is:

1. A sensor comprising:
a receptacle capable of being connected to an external plug;
a second housing in which at least a part of the receptacle is accommodated;
a main substrate on which an electronic component used for sensing is mounted;
a shield film covering at least a part of the main substrate and shielding at least one of an electromagnetic wave emitted from the main substrate and an electromagnetic wave to penetrate the main substrate from an outside;
a first housing in which at least a part of the main substrate and at least a part of the shield film are accommodated;
a flexible connection member connecting the main substrate and the receptacle; and
a protection member abutting on an end of the shield film from a side opposite to the main substrate, the end of the shield film facing the connection member.

2. The sensor according to claim 1, further comprising a sealing resin that seals the electronic component used for sensing,
wherein the protection member has a cantilever structure in which one end of the protection member abuts on the end of the shield film, and another end is buried and fixed in the sealing resin.

3. The sensor according to claim 2, further comprising a cylindrical insulating member fitted inside the second housing,
wherein the shield film comprises:
a winding part that is wound around the main substrate in a lateral direction intersecting a longitudinal direction of the main substrate, covers a part of a front surface and a part of a back surface of the main substrate, and covers a part of an end surface of the main substrate; and
a tongue part that protrudes from the winding part and covers only a part of the front surface and/or a part of the back surface of the main substrate,
wherein at least a part of the tongue part configures the end of the shield film facing the connection member, and overlaps the insulating member in a thickness direction of the main substrate.

4. The sensor according to claim 3, wherein the protection member is made of a material having higher rigidity than the connection member.

5. The sensor according to claim 4, wherein the protection member is made of an FR-4 grade laminate that conforms to ANSI standards.

6. The sensor according to claim 2, wherein the protection member is made of a material having higher rigidity than the connection member.

7. The sensor according to claim 6, wherein the protection member is made of an FR-4 grade laminate that conforms to ANSI standards.

8. The sensor according to claim 1, further comprising a cylindrical insulating member fitted inside the second housing,
wherein the shield film comprises:
a winding part that is wound around the main substrate in a lateral direction intersecting a longitudinal direction of the main substrate, covers a part of a front surface and a part of a back surface of the main substrate, and covers a part of an end surface of the main substrate; and
a tongue part that protrudes from the winding part and covers only a part of the front surface and/or a part of the back surface of the main substrate,
wherein at least a part of the tongue part configures the end of the shield film facing the connection member, and overlaps the insulating member in a thickness direction of the main substrate.

9. The sensor according to claim 8, wherein the protection member is made of a material having higher rigidity than the connection member.

10. The sensor according to claim 9, wherein the protection member is made of an FR-4 grade laminate that conforms to ANSI standards.

11. The sensor according to claim 1, wherein the protection member is made of a material having higher rigidity than the connection member.

12. The sensor according to claim 11, wherein the protection member is made of an FR-4 grade laminate that conforms to ANSI standards.

13. A sensor comprising:
a main substrate on which an electronic component used for sensing is mounted;
a shield film covering at least a part of the main substrate and shielding at least one of an electromagnetic wave emitted from the main substrate and an electromagnetic wave to penetrate the main substrate from an outside;
a protection member abutting on an end of the shield film from a side opposite to the main substrate; and a sealing resin that seals the electronic component used for sensing,
wherein the protection member has a cantilever structure in which one end of the protection member abuts on the end of the shield film, and another end is buried and fixed in the sealing resin.

* * * * *